US009355726B2

(12) United States Patent
Lee

(10) Patent No.: US 9,355,726 B2
(45) Date of Patent: May 31, 2016

(54) EPROM CELL ARRAY, METHOD OF OPERATING THE SAME, AND MEMORY DEVICE INCLUDING THE SAME

(71) Applicant: SK hynix Inc., Gyeonggi-do (KR)

(72) Inventor: Yong Seop Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/341,505

(22) Filed: Jul. 25, 2014

(65) Prior Publication Data

US 2015/0310918 A1    Oct. 29, 2015

(30) Foreign Application Priority Data

Apr. 29, 2014  (KR) .................. 10-2014-0051419

(51) Int. Cl.
  *G11C 11/34*    (2006.01)
  *G11C 16/04*    (2006.01)
  *G11C 17/14*    (2006.01)
  *G11C 17/16*    (2006.01)
  *G11C 17/18*    (2006.01)
(52) U.S. Cl.
  CPC ............ *G11C 16/0416* (2013.01); *G11C 16/04* (2013.01); *G11C 17/14* (2013.01); *G11C 17/16* (2013.01); *G11C 17/18* (2013.01)

(58) Field of Classification Search
  CPC ...... G11C 16/0416; G11C 16/10; G11C 16/26
  USPC .......................................... 365/185.18, 185.29
  See application file for complete search history.

(56) References Cited

U.S. PATENT DOCUMENTS

| | | | |
|---|---|---|---|
| 5,199,001 A | 3/1993 | Tzeng | |
| 5,590,076 A * | 12/1996 | Haddad | .................. G11C 16/10 365/185.12 |
| 7,436,701 B2 | 10/2008 | Oberhuber | |
| 2006/0133151 A1 * | 6/2006 | Oberhuber | .......... G11C 16/0425 365/185.18 |
| 2010/0172184 A1 * | 7/2010 | Roizin et al. | ............. 365/185.18 |
| 2014/0085984 A1 * | 3/2014 | Lee et al. | ................. 365/185.18 |

\* cited by examiner

*Primary Examiner* — Richard Elms
*Assistant Examiner* — Mohammed A Bashar
(74) *Attorney, Agent, or Firm* — IP & T Group LLP

(57) ABSTRACT

An EPROM cell array includes a cell array including multiple unit cells, each of which includes a MOSFET having a floating gate, and which are disposed in an array with a plurality of rows and a plurality of columns; multiple first selection lines each coupled with drains of unit cells, which are disposed on the same row among the multiple unit cells; and multiple second selection lines each coupled with sources of unit cells, which are disposed on the same column among the unit cells, wherein a selected unit cell to be programmed or read is selected by one of the multiple first selection lines, and one of the multiple second selection lines.

17 Claims, 12 Drawing Sheets

EPROM CELL ARRAY, METHOD OF OPERATING THE SAME, AND MEMORY DEVICE INCLUDING THE SAME

CROSS-REFERENCE TO RELATED APPLICATION

The present application claims priority under 35 U.S.C. §119(a) to Korean application number 10-2014-0051419 filed on Apr. 29, 2014 in the Korean Intellectual Property Office, which is incorporated herein by reference in its entirety

BACKGROUND

1. Technical Field

Various exemplary embodiments of the present disclosure relate to a nonvolatile memory device, and more particularly, to an EPROM cell array, a method of operating the same, and a memory device including the same.

2. Related Art

Unlike a random access memory (RAM), an electrically programmable ROM (EPROM) retains information even though power supply thereto is switched off. The EPROM device includes a field effect transistor (FET), which has a source, a drain and a conductive channel between the source and the drain. The FET has a floating gate disposed over the channel. Information may be stored as a charge that is injected into the floating gate, which is electrically isolated. The charge remains in the floating gate even though power supply is switched off because it is electrically isolated. The charge of the floating gate exerts influence on the conductivity of the channel between the source and the drain. Therefore, by detecting current flowing through the channel, information may be read from the FET device.

SUMMARY

Various exemplary embodiments of the present disclosure are directed to an EPROM cell, a method of operating the same, and a memory device including the same.

In an embodiment, an EPROM cell array may include: a cell array including multiple unit cells, each of which includes a MOSFET having a floating gate, and which are disposed in an array with a plurality of rows and a plurality of columns; multiple first selection lines each coupled with drains of unit cells, which are disposed on the same row among the multiple unit cells; and multiple second selection lines each coupled with sources of unit cells, which are disposed on the same column among the unit cells, wherein a selected unit cell to be programmed or read is selected by one of the multiple first selection lines, and one of the multiple second selection lines.

In an embodiment, there is provided a method for operating an EPROM cell array including a cell array having multiple unit cells, each of which includes a MOSFET having a floating gate, and which are disposed in an array with a plurality of rows and a plurality of columns, multiple first selection lines each coupled with drains of unit cells disposed on the same row among the unit cells, and multiple second selection lines each coupled with sources of unit cells disposed on the same column among the unit cells, the method may include: selecting one of the multiple unit cells by applying 0V to one of the multiple first selection lines, by applying an operation voltage to one of the multiple second selection lines, and by floating the remaining ones of the multiple first and second selection lines; and performing an operation on the selected unit cell.

In an embodiment, a memory device may include: an EPROM cell array including a cell array having multiple unit cells, each of which includes a MOSFET having a floating gate, and which are disposed in an array with a plurality of rows and a plurality of columns, multiple first selection lines each coupled with drains of unit cells disposed on the same row among the unit cells, and multiple second selection lines each coupled with sources of unit cells disposed on the same column among the unit cells; a switching block suitable for selectively applying 0V to one or more of the multiple first selection lines; a first demultiplexer suitable for selectively enabling the switching block; a second demultiplexer suitable for selecting one or more of the multiple second selection lines; and one or more switching elements suitable for transferring the program voltage or the read voltage to the second demultiplexer.

In an embodiment, a memory device may include: an EPROM cell array including a cell array having multiple unit cells, each of which includes a MOSFET having a floating gate, and which are disposed in an array with a plurality of rows and a plurality of columns, multiple first selection lines each coupled with drains of unit cells disposed on the same row among the unit cells, and multiple second selection lines each coupled with sources of unit cells disposed on the same column among the unit cells; a switching block suitable for selectively applying 0V to one or more of the multiple first selection lines; a first demultiplexer suitable for selectively enabling the switching block; multiple sense amplifiers coupled to the multiple second selection lines, respectively; and multiple switching elements coupled between the multiple second selection lines and the multiple sense amplifiers, respectively, and suitable for selectively transferring the program voltage or the read voltage to the multiple second selection lines.

In an embodiment, a cell array may include: multiple unit cells, each of which includes one or more MOSFETs; multiple row selection lines, each of which is coupled to the unit cells of a row in the cell array; and multiple column selection lines, each of which is coupled to the unit cells of a column in the cell array, wherein a selected unit cell for program or read operation is selected in the cell array by one of the multiple row selection lines, to which a reference voltage is applied, and one of the multiple column selection lines, to which an operation voltage is applied.

In an embodiment, a method for operating a cell array including multiple unit cells, each of which includes one or more MOSFETs, multiple row selection lines, each of which is coupled to the unit cells of a row in the cell array, and multiple column selection lines, each of which is coupled to the unit cells of a column in the cell array, the method may include: selecting one or more of the multiple unit cells by applying a reference voltage to one or more of the multiple row selection lines, and by applying an operation voltage to one or more of the multiple column selection lines; and performing an operation on the selected unit cells.

In an embodiment, a memory device may include: a cell array including multiple unit cells, each of which includes one or more MOSFETs, multiple row selection lines, each of which is coupled to the unit cells of a row in the cell array, and multiple column selection lines, each of which is coupled to the unit cells of a column in the cell array; a row selection portion suitable for selectively applying a reference voltage to one or more of the multiple row selection lines in response to a row selection command; and a column selection portion suitable for selectively applying an operation voltage to one or more of the multiple column selection lines in response to a column selection command.

BRIEF DESCRIPTION OF THE DRAWINGS

Embodiments of the present disclosure will become more apparent in view of the attached drawings and accompanying detailed description, in which.

DETAILED DESCRIPTION

Hereinafter, an EPROM cell array, a method of operating the same, and a memory device including the same will be described below with reference to the accompanying drawings through various examples of embodiments.

In the present disclosure it will be understood that when an element is referred to as being located "on", "over", "above", "under", "beneath" or "below" another element, it can be directly contacting the other element, or at least one intervening element may be present therebetween. Accordingly, the terms such as "on", "over", "above", "under", "beneath", "below" and the like are used herein are for the purpose of describing particular embodiments only and are not intended to limit the scope of the present disclosure.

A selection transistor for selecting one of a plurality of unit cells included in an EPROM cell array, which has a field effect transistor (FET) with a floating gate of a metal oxide semiconductor (MOS) structure, or a MOSFET, as the unit cell, is required for performing program and read operations on a selected unit cell. A number of the selection transistors are needed to equal the number of the plurality of unit cells, and due to this fact, the area of an existing EPROM cell array markedly increases. In accordance with various exemplary embodiments of the present disclosure, program and read operations may be performed for a specified unit cell without a selection transistor in the EPROM cell array, which may reduce the area of the EPROM cell array.

Figure 1:
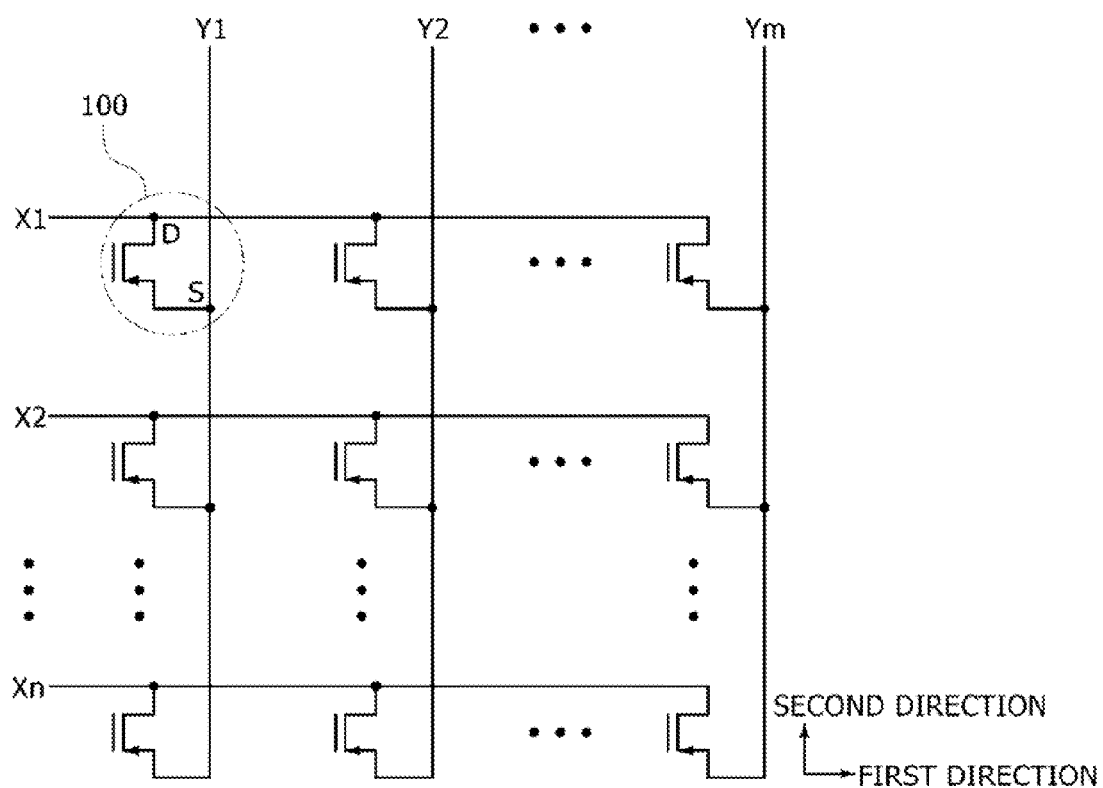
FIG. 1 is a diagram illustrating an EPROM cell array according to an embodiment of the present disclosure.

FIG. 1 is a diagram illustrating an EPROM cell array 10 in accordance with an embodiment. Referring to FIG. 1, the EPROM cell array 10 may include a plurality of unit cells 100, which are disposed in the form of an m×n array along a first direction and a second direction. The first direction and the second direction may cross with each other. The unit cells 100 which are disposed on the same row along the first direction, may be electrically coupled with one of a plurality of common first selection lines X1 to Xn. The unit cells 100, which are disposed on the same column along the second direction, may be electrically coupled with one of a plurality of common second selection lines Y1 to Ym. The number of the first selection lines X1 to Xn may correspond to the number of the rows of the EPROM cell array 10, and the number of the second selection lines Y1 to Ym may correspond to the number of the columns of the EPROM cell array 10. Each unit cell 100 may have a drain D and a source S. The drain D of each unit cell 100 may be electrically coupled with a corresponding one of the plurality of first selection lines X1 to Xn. The source S of each unit cell 100 may be electrically coupled with a corresponding one of the plurality of second selection lines Y1 to Ym.

Figure 2:
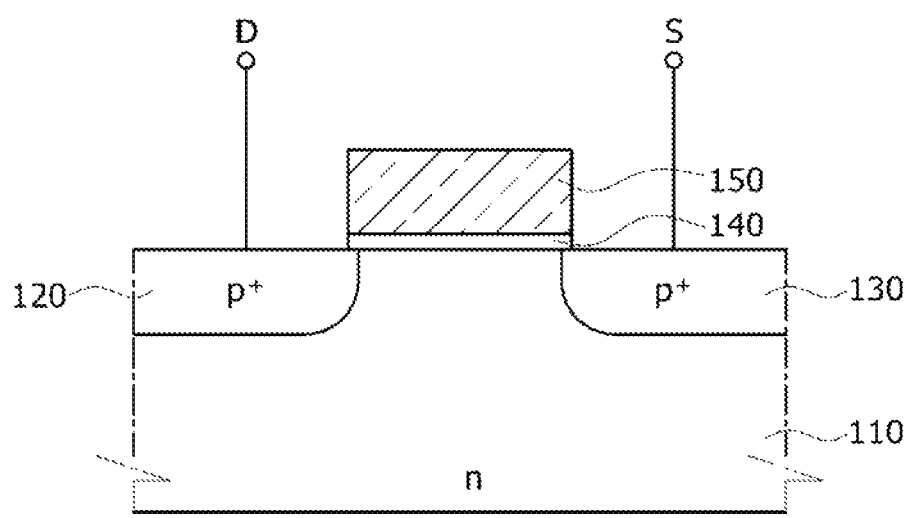
FIG. 2 is a cross-sectional view illustrating a unit cell shown in FIG. 1.

FIG. 2 is a cross-sectional view illustrating the unit cell 100 shown in FIG. 1. Referring to FIG. 2, the unit cell 100 may have a (p+)-type drain region 120 and a (p+)-type source region 130, which are disposed to be separated from each other, over an n-type substrate 110. In another example, when the substrate 110 is of p conductivity type, n-type well regions may be formed in the substrate 110, and the drain region 120 and the source region 130 may be disposed in the n-type well regions. The upper region of the n-type substrate 110 between the drain region 120 and the source region 130 may serve as a channel region. A gate insulating layer 140 and a floating gate layer 150 may be sequentially disposed on the channel region. The gate insulating layer 140 may include an oxide layer. The floating gate layer 150 may include a polysilicon layer. The drain region 120 may be electrically coupled to the drain D, and accordingly, may be electrically coupled with one of the plurality of first selection lines X1 to Xn. The source region 130 may be electrically coupled with the source S, and accordingly, may be electrically coupled with one of the plurality of second selection lines Y1 to Ym. The floating gate layer 150 may be disposed in a floating state without electrical contact.

The operation of the unit cell 100 may depend on charge transportation to the floating gate layer 150 by avalanche injection of electrons. When an avalanche injection condition is satisfied in the drain region 120 or the source region 130, charges may be transferred to the floating gate layer 150. When a positive program voltage is applied to the source region 130 with the drain region 120 grounded, the positive program voltage applied to the source region 130 may be transferred to the substrate 110, and accordingly, a reverse bias may be applied to the substrate 110 and the drain region 120. When the positive program voltage is large enough, an avalanche breakdown may be induced in the junction between the substrate 110 and the drain region 120, and a strong electric field may be created between the drain region 120 and the substrate 110. Because of the strong electric field, hot electrons in a depletion region between the drain region 120 and the substrate 110 start to accumulate in the floating gate layer 150 through the gate insulating layer 140. As electrons accumulate in the floating gate layer 150, the threshold voltage of the unit cell 100 may be lowered, and the unit cell 100 may reach a programmed state.

Figure 3:
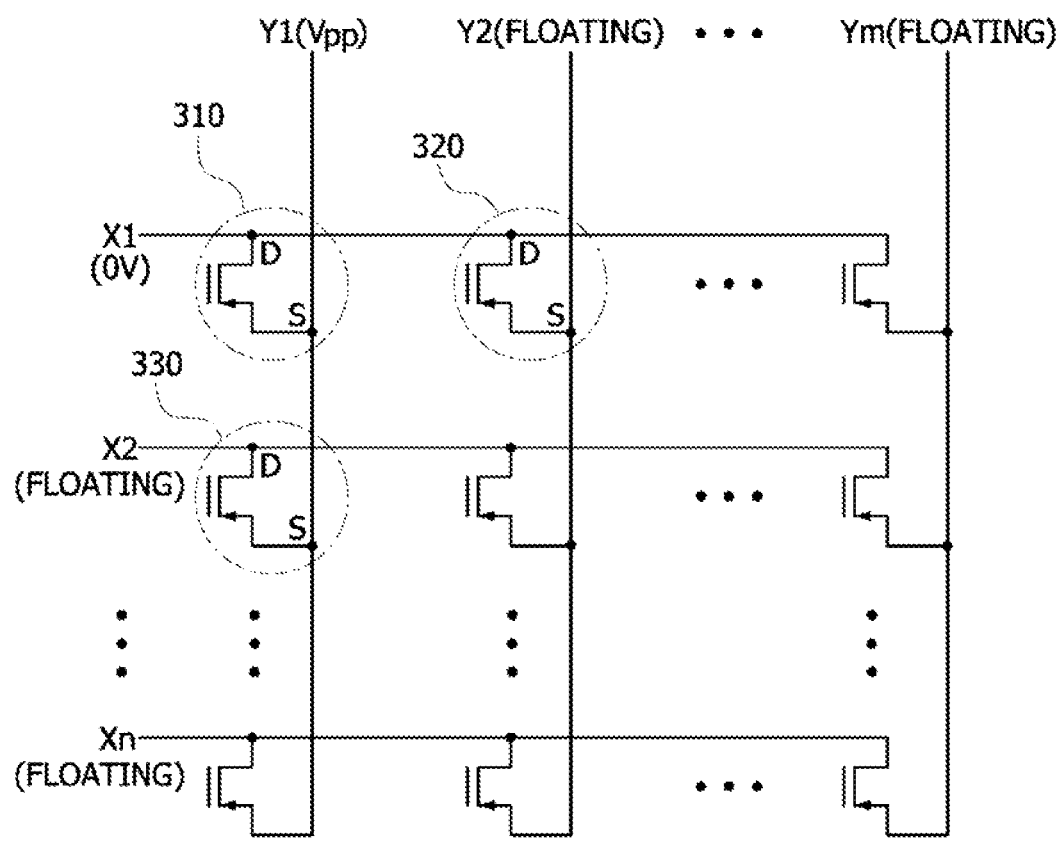
FIG. 3 is a diagram illustrating a program operation of an EPROM cell array according to an embodiment of the present disclosure.

FIG. 3 is a diagram illustrating a program operation of the EPROM cell array 10 according to an embodiment of the present disclosure. Referring to FIG. 3, when programming a selected unit cell 310, 0V may be applied to the first selection line X1, which is electrically coupled to the drain D of the selected unit cell 310, and the remaining first selection lines X2 to Xn may float. Also, a positive program voltage Vpp may be applied to the second selection line Y1, which is electrically coupled to the source S of the selected unit cell 310, and the remaining second selection lines Y2 to Ym may float. As 0V and the positive program voltage Vpp are applied to the first selection line X1 and the second selection line Y1, hot electrons may accumulate in the floating gate layer of the unit cell 310, and the unit cell 310 may be in the program state as described above with reference to FIG. 2. Meanwhile, as the sources S of unselected unit cells sharing the first selection line X1 with the selected unit cell 310, for example a unit cell 320, are floated due to the floating status of the second selection line, an avalanche breakdown does not occur although 0V is applied to the drain D, and as a result, the unselected unit cell 320 may not be programmed. Also, as the drains D of unselected unit cells sharing the second selection line Y1 with the selected unit cell 310, for example a unit cell 330, are floated due to the floating status of the first selection line, an avalanche breakdown does not occur although the positive program voltage Vpp is applied to the source S, and as a result, the unselected unit cell 330 may not be programmed. The remaining unit cells, which do not share the first selection line X1 and the second selection line Y1 with the selected unit cell 310, may have the floating drains D and sources S, and thus may not be programmed.

Figure 4:
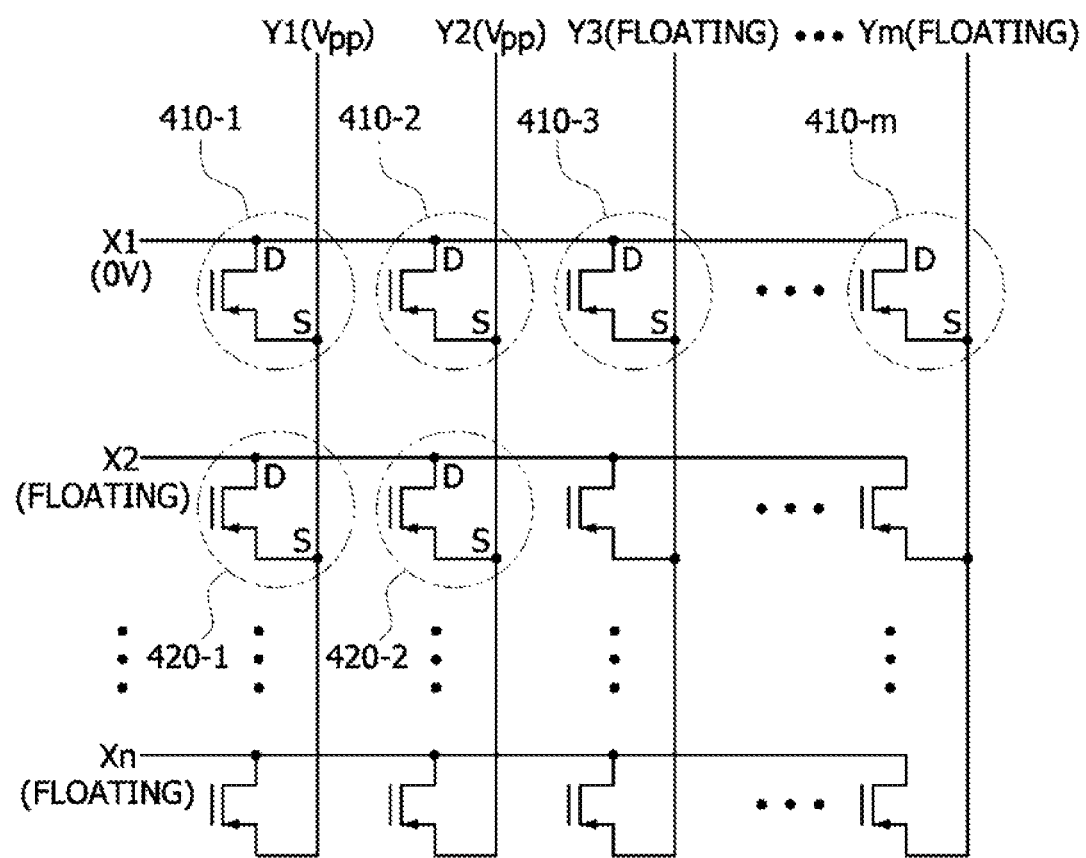
FIG. 4 is a diagram illustrating a program operation of an EPROM cell array according to an embodiment of the present disclosure.

FIG. 4 is a diagram illustrating a program operation of an EPROM cell array 10 according to an embodiment of the present disclosure. FIG. 4 shows a simultaneous program operation for two or more selected unit cells sharing a single first selection line. Referring to FIG. 4, when simultaneously programming two unit cells 410-1 and 410-2 among unit cells 410-1 to 410-m sharing the first selection line X1 0V may be applied to the first selection line X1, which is electrically coupled to the selected unit cells 410-1 and 410-2, and the remaining first selection lines X2 to Xn may float. Also, the positive program voltage Vpp may be applied to the second selection lines Y1 and Y2, which are electrically coupled to the selected unit cells 410-1 and 410-2 respectively, and the remaining second selection lines Y3 to Ym may float. As 0V and the positive program voltage Vpp are applied to the drains D and the sources S of the selected unit cells 410-1 and 410-2 respectively the program operation may be performed on the selected unit cells 410-1 and 410-2.

Meanwhile, as sources S of the unselected unit cells 410-3 to 410-m sharing the first selection line X1 with the selected unit cells 410-1 and 410-2 are floated due to the floating status of the second selection lines, the program operation may not be performed although 0V is applied to the drains D. Also, as the drains D of the unselected unit cells sharing the second selection lines Y1 and Y2 with the selected unit cells 410-1 and 410-2, for example unit cells 420-1 and 420-2 are floated due to the floating status of the first selection line, the unselected unit cells 420-1 and 420-2 may not be programmed although the positive program voltage Vpp may be applied to the source S. The remaining unit cells, which do not share the first selection line Xi and the second selection lines Y1 and Y2 with the selected unit cells 410-1 and 410-2, may have the floating drains D and sources S, and thus may not be programmed.

The above-described simultaneous program operation for two selected unit cells sharing a single first selection line may be applied to cases of three or more selected unit cells sharing a single first selection line. For example, when 0V is applied to the first selection line X1 the remaining first selection lines X2 to Xn are floated, the positive program voltage Vpp is applied to three or more second selection lines, and the remaining second selection lines are floated, the plurality of selected unit cells electrically coupled to the first selection line X1 and the Vpp-applied second selection lines may be simultaneously programmed. Also, all the unit cells 410-1 to 410-m sharing the first selection line X1 may be simultaneously programmed in accordance with an exemplary embodiment of the present disclosure, by applying 0V to the first selection line X1, making the remaining first selection lines X2 to Xn floated, and applying the positive program voltage Vpp to all the second selection lines Y1 to Ym.

Figure 5:
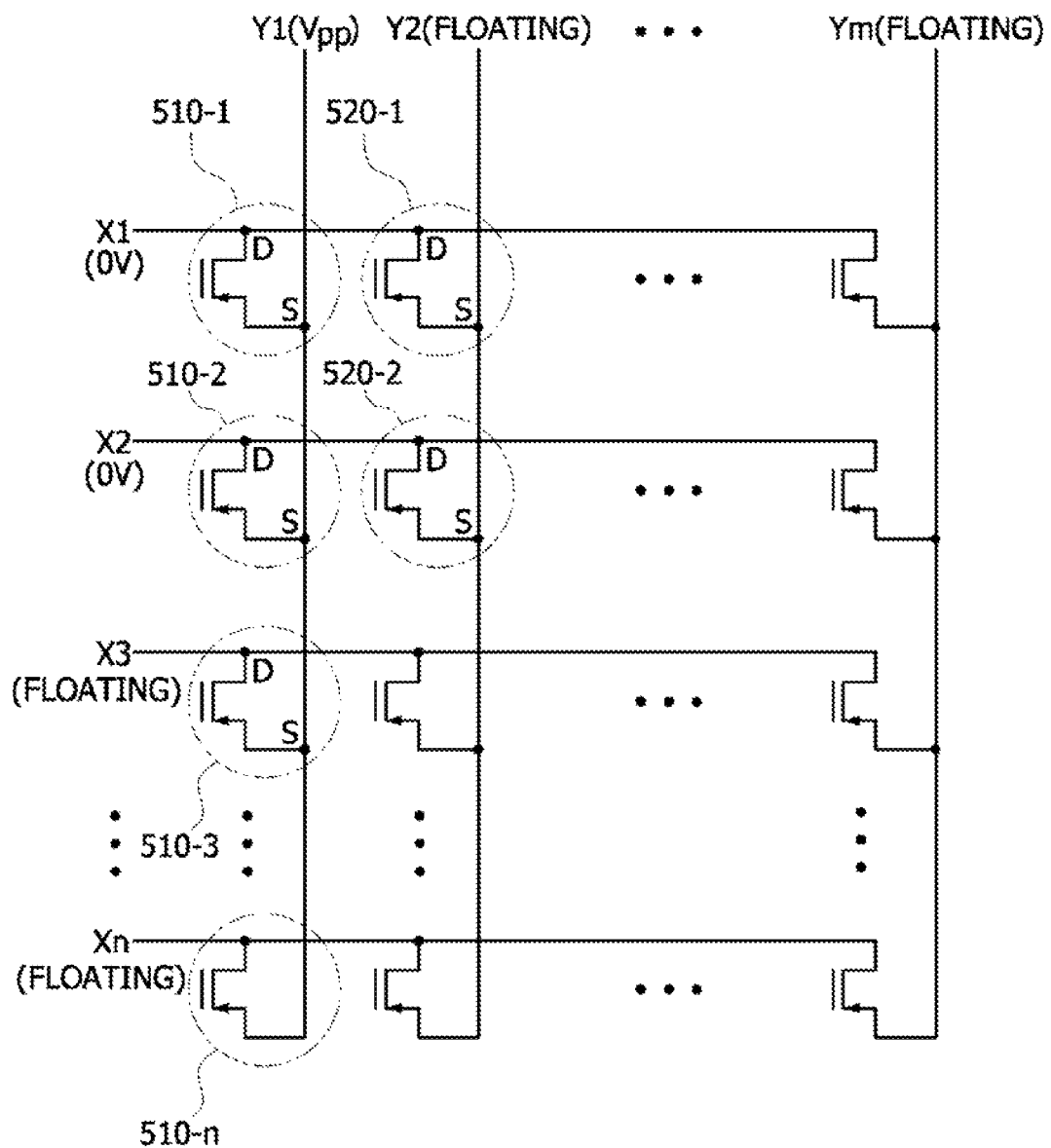
FIG. 5 is a diagram illustrating a program operation of an EPROM cell array according to an embodiment of the present disclosure.

FIG. 5 is a diagram illustrating a program operation of the EPROM cell array 10 according to an embodiment of the present disclosure 1. FIG. 5 shows a simultaneous program operation for two or more selected unit cells sharing a single second selection line. Referring to FIG. 5, when simultaneously programming two unit cells 510-1 and 510-2 among unit cells 510-1 to 510-n sharing the second selection line Y1 the positive program voltage Vpp may be applied to the second selection line Y1, which is electrically coupled to the selected unit cells 510-1 and 510-2, and the remaining second selection lines Y2 to Ym may float. Also, 0V may be applied to the first selection lines X1 and X2, which are electrically coupled to the selected unit cells 510-1 and 510-2, respectively, and the remaining first selection lines X3 to Xn may float. As 0V and the positive program voltage Vpp may be applied to the drains D and the sources S of the selected unit cells 510-1 and 510-2, respectively, the program operation may be performed on the selected unit cells 510-1 and 510-2.

Meanwhile, as drains D of the unselected unit cells 510-3 to 510-n sharing the second selection line Y1 with the selected unit cells 510-1 and 510-2 are floated due to the floating status of the first selection lines, the program operation may not be performed although the positive program voltage Vpp is applied to the sources S. Also, as the sources S of the unselected unit cells sharing the first selection lines X1 and X2 with the selected unit cells 510-1 and 510-2, for example unit cells 520-1 and 520-2 are floated due to the floating status of the second selection line, the unselected unit cells 520-1 and 520-2 may not be programmed although 0V may be applied to the drain D. The remaining unit cells, which do not share the second selection line Y1 and the first selection lines X1 and X2 with the selected unit cells 510-1 and 510-2, may have the floating drains D and sources S, and thus may not be programmed.

The above-described simultaneous program operation for two selected unit cells sharing a single second selection line may be applied to cases of three or more selected unit cells sharing a single second selection line. For example, when the positive program voltage Vpp is applied to the second selection line Y1, the remaining second selection lines Y2 to Ym are floated, 0V is applied to three or more first selection lines, and the remaining first selection lines are floated, the plurality of selected unit cells electrically coupled to the 0V-applied first selection lines and the second selection line Y1 may be simultaneously programmed. Also, all the unit cells 510-1 to 510-n sharing the second selection line Y1 may be simultaneously programmed in accordance with an exemplary embodiment of the present disclosure, by applying the positive program voltage Vpp to the second selection line Y1, making the remaining second selection lines Y2 to Ym floated, and applying 0V to all the first selection lines X1 to Xn.

Figure 6:
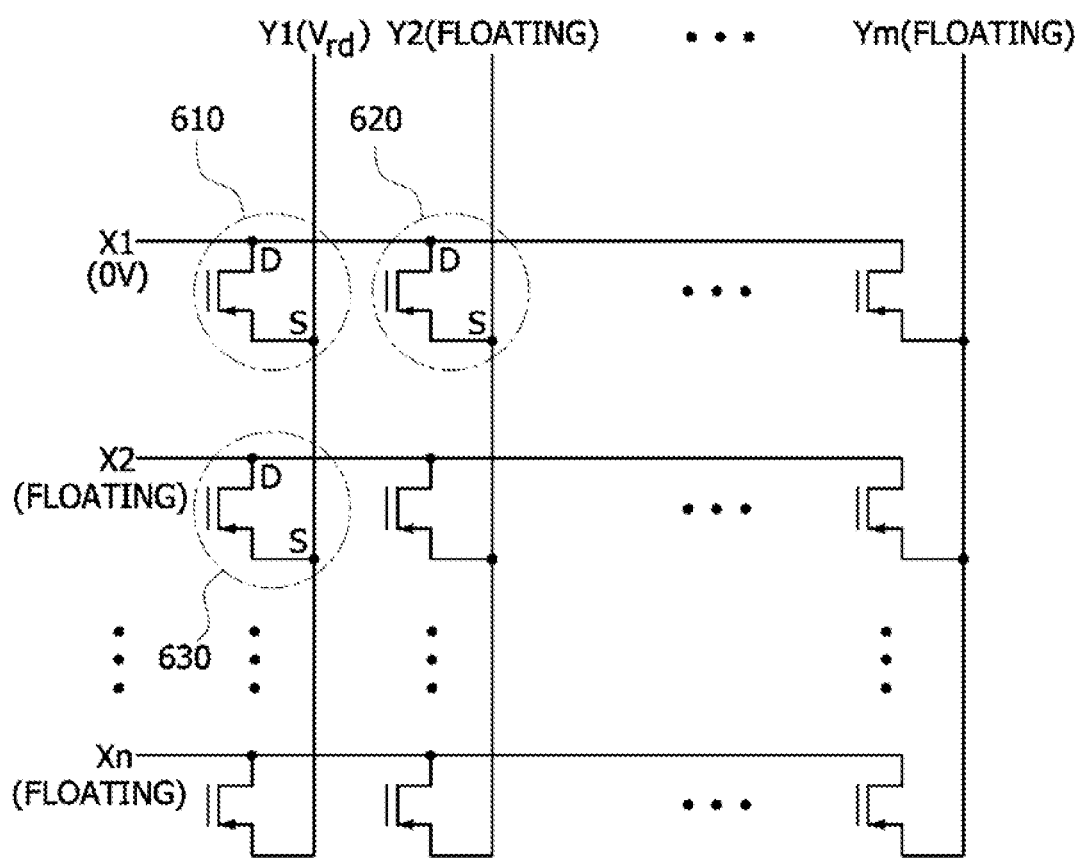
FIG. 6 is a diagram illustrating a read operation of an EPROM cell array according to an embodiment of the present disclosure.

FIG. 6 is a diagram illustrating a read operation of the EPROM cell array 10 according to an embodiment of the present disclosure. Referring to FIG. 6, when reading a selected unit cell 610, 0V may be applied to the first selection line X1, which is electrically coupled to the drain D of the selected unit cell 610, and the remaining first selection lines X2 to Xn may float. Also, a positive read voltage Vrd may be applied to the second selection line Y1, which is electrically coupled to the source S of the selected unit cell 610, and the remaining second selection lines Y2 to Ym may float. As 0V and the positive read voltage Vrd are applied to the first selection line X1 and the second selection line Y1, current may or may not flow from the source S to the drain D according to the threshold voltage of the unit cell 610 or the program state of the unit cell 610. When the unit cell 610 is in a programmed state, that is, the unit cell 610 has a low threshold voltage, current may flow from the source S to the drain D. Conversely, when the unit cell 610 is not in a programmed state, that is, the unit cell 610 has a high threshold voltage, no current or a leakage current may flow from the source S to the drain D. In this way, by sensing current flowing between the source S and the drain D of the unit cell 610, it is possible to determine whether the unit cell 610 is in a programmed state or not.

Meanwhile, as the sources S of unselected unit cells sharing the first selection line XI with the selected unit cell 610, for example a unit cell 620, are floated due to the floating status of the second selection line, current does not flow between the source S and the drain D, although 0V may be applied to the drain D. Also, as the drains D of unselected unit cells sharing the second selection line Y1 with the selected unit cell 610, for example a unit cell 630, are floated due to the floating status of the first selection line, current does not flow between the source S and the drain D although the positive read voltage Vrd is applied to the source S. The remaining unit cells, which do not share the first selection line X1 and the second selection line Y1 with the selected unit cell 610, may have floating drains D and sources S, and thus current may not flow between the sources S and the drains D of the remaining unit cells.

Figure 7:
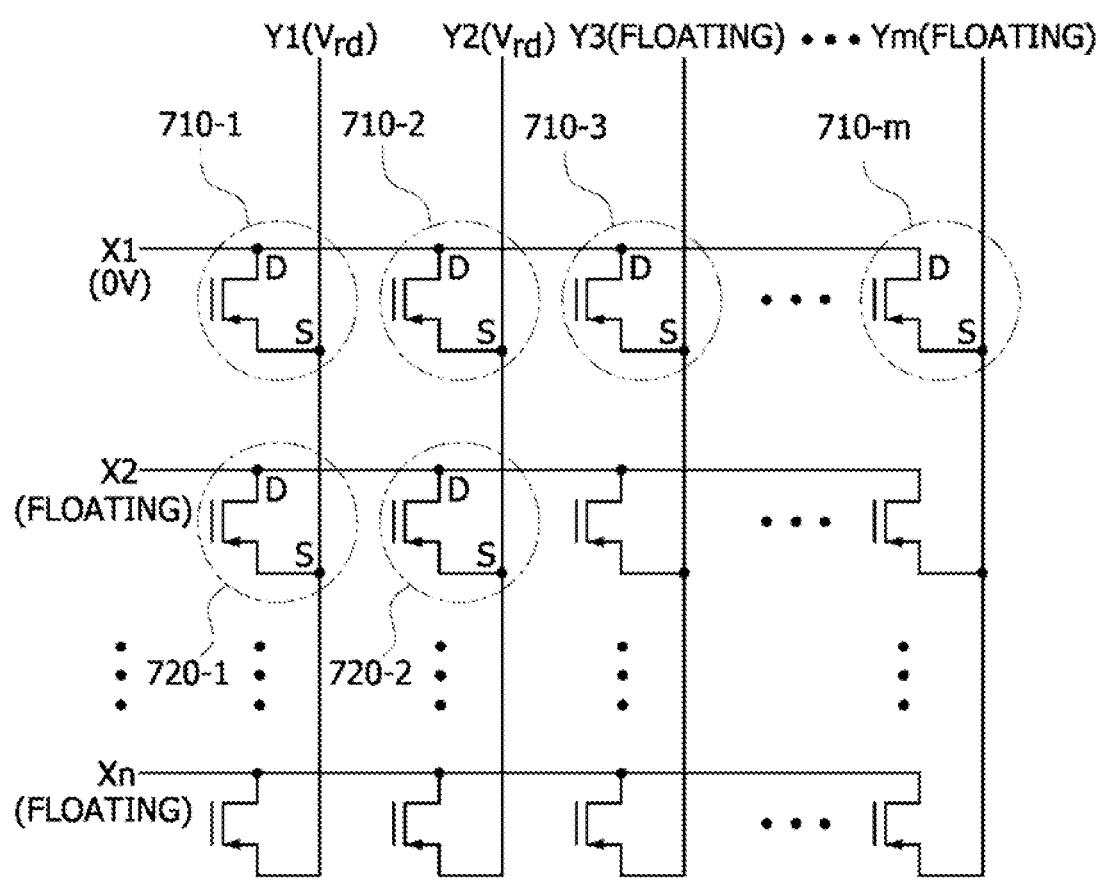
FIG. 7 is a diagram illustrating a read operation of an EPROM cell array according to an embodiment of the present disclosure.

FIG. 7 is a diagram illustrating a read operation of the EPROM cell array 10 according to an embodiment of the present disclosure. FIG. 7 shows a simultaneous read operation for two or more selected unit cells sharing a single first selection line. Referring to FIG. 7, when simultaneously reading two unit cells 710-1 and 710-2 among unit cells 710-1 to 710-*m* sharing the first selection line X1 0V may be applied to the first selection line X1, which is electrically coupled to the selected unit cells 710-1 and 710-2, and the remaining first selection lines X2 to Xn may float. Also, the positive read voltage Vrd may be applied to the second selection lines Y1 and Y2, which are electrically coupled to the selected unit cells 710-1 and 710-2, respectively, and the remaining second selection lines Y3 to Ym may float. As 0V and the positive program voltage Vpp are applied to the drains D and the sources S of the selected unit cells 710-1 and 710-2, respectively, current may or may not flow between the sources S and the drains D of the selected unit cells 710-1 and 710-2 according to the program states of the selected unit cells 710-1 and 710-2. The states of the selected unit cells 710-1 and 710-2 may be read by sensing current flowing through the second selection lines Y1 and Y2, respectively.

Meanwhile, as sources S of the unselected unit cells 710-3 to 710-*m* sharing the first selection line X1 with the selected unit cells 710-1 and 710-2 are floated due to the floating status of the second selection lines, current may not flow between the sources S and the drains D of the unselected unit cells 710-3 to 710-*m* although 0V may be applied to the drains D. Also, as the drains D of the unselected unit cells sharing the second selection lines Y1 and Y2 with the selected unit cells 710-1 and 710-2, for example unit cells 720-1 and 720-2 are floated due to the floating status of the first selection line, current may not flow between the sources S and the drains D of the unit cells 720-1 and 720-2 although the positive read voltage Vrd may be applied to the sources S. The remaining unit cells, which do not share the first selection line X1 and the second selection lines Y1 and Y2 with the selected unit cells 710-1 and 710-2, may have floating drains D and sources S, and thus current may not flow between the sources S and the drains D of the remaining unit cells.

The above-described simultaneous read operation for two selected unit cells sharing a single first selection line may be applied to cases of three or more selected unit cells sharing single first selection line. For example, when 0V is applied to the first selection line X1, the remaining first selection lines X2 to Xn are floated, the positive read voltage Vrd is applied to three or more second selection lines, and the remaining second selection lines are floated, the plurality of selected unit cells electrically coupled to the first selection line X1 and the Vrd-applied second selection lines may be simultaneously read. Also, all the unit cells 710-1 to 710-*m* sharing the first selection line X1 may be simultaneously read in accordance with an exemplary embodiment of the present disclosure, by applying 0V to the first selection line X1 making the remaining first selection lines X2 to Xn floated and applying the positive read voltage Vrd to all the second selection lines Y1 to Ym.

Figure 8:
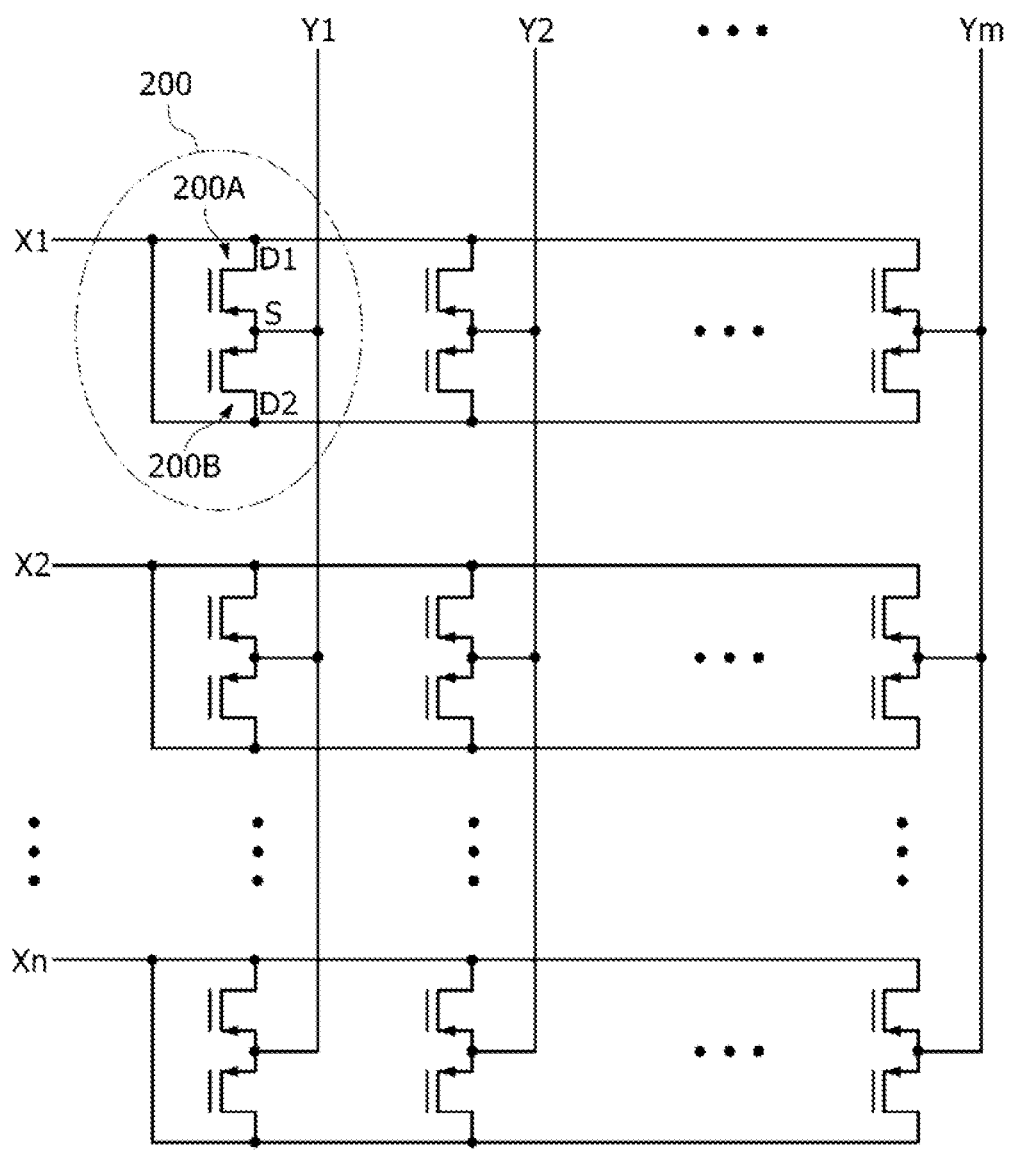
FIG. 8 is a diagram illustrating an EPROM cell array according to an embodiment of the present disclosure.

FIG. 8 is a diagram illustrating an EPROM cell array 20 in accordance with an embodiment of the present disclosure. Referring to FIG. 8, the EPROM cell array 20 may include a plurality of unit cells 200, which are disposed in the form of an m×n array along a first direction and a second direction. The first direction and the second direction may cross each other. The unit cells 200, which are disposed on the same row along the first direction, may be electrically coupled with one of a plurality of common first selection lines X1 to Xn. The unit cells 200, which are disposed on the same column along the second direction, may be electrically coupled with one of a plurality of common second selection lines Y1 to Ym. The number of the first selection lines X1 to Xn may correspond to the number of the rows of the EPROM cell array 20, and the number of the second selection lines Y1 to Ym may correspond to the number of the columns of the EPROM cell array 20.

Each unit cell 200 may have a first MOSFET 200A and a second MOSFET 200B, which are electrically coupled to each other in parallel. The first MOSFET 200A and the second MOSFET 200B may be p channel type. The first MOSFET 200A may have a first drain D1 and a common source S. The second MOSFET 200B may have a second drain D2 and the common source S. The first drain D1 of the first MOSFET 200A and the second drain D2 of the second MOSFET 200B may be electrically coupled with each other, and may be electrically coupled with one of the plurality of first selection lines X1 to Xn. The first MOSFET 200A and the second MOSFET 200B may share the common source S, and may be electrically coupled with one of the plurality of second selection lines Y1 to Ym.

According to an exemplary embodiment of the present disclosure, when performing program and read operations for the unit cell 200, the program operations and the read operations may be performed together for both of the first MOSFET 200A and the second MOSFET 200B. According to an exemplary embodiment of the present disclosure, even though a program error or a read error occurs in one of the first MOSFET 200A and the second MOSFET 200B, the program operation and the read operation may be normally performed for the unit cell 200 because the other first MOSFET 200A or the second MOSFET 200B, which behaves normally, may be used. Consequently, it is possible to improve the redundancy characteristics of the EPROM cell array 20.

Figure 9:
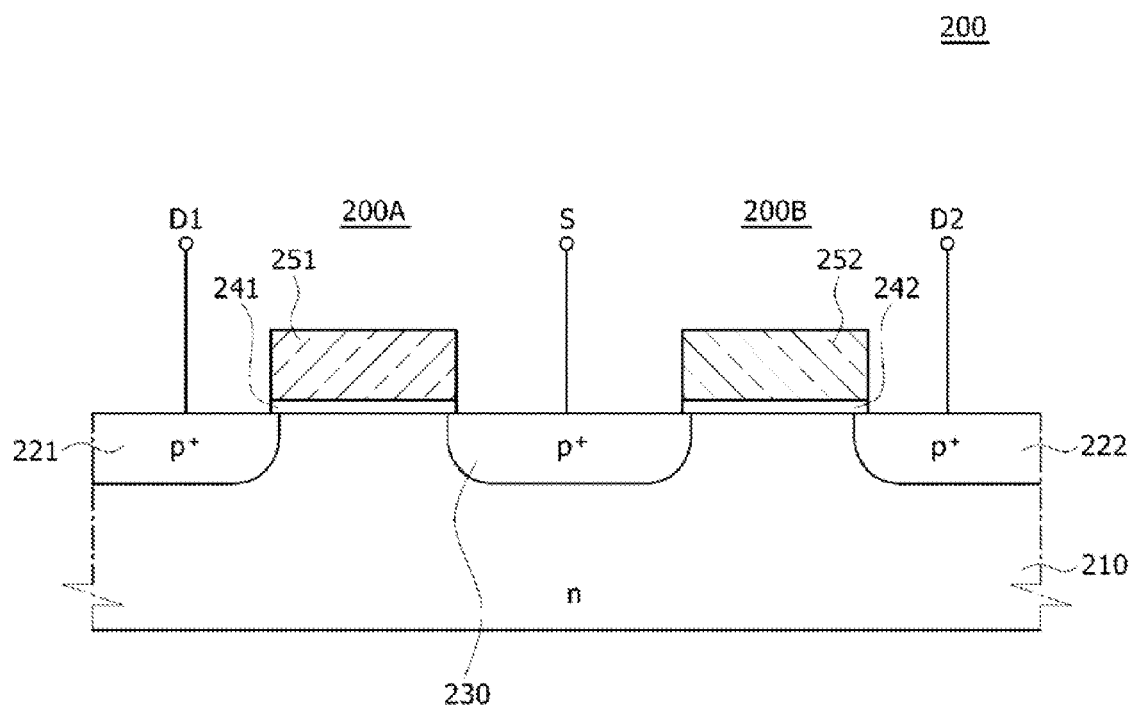
FIG. 9 is a cross-sectional view illustrating a unit cell shown in FIG. 8.

FIG. 9 is a cross-sectional view illustrating the unit cell 200 shown in FIG. 8. Referring to FIG. 9, the unit cell 200 may have a first drain region 221, a common source region 230 and a second drain region 222, which are disposed to be separated from one another, over a substrate 210 of n conductivity type. The first drain region 221, the common source region 230, and the second drain region 222 may be of p+ conductivity type. In another example, when the substrate 210 is of p conductivity type, n-type well regions may be formed in the substrate 210, and the first drain region 221, the common source region 230, and the second drain region 222 may be disposed in the n-type well regions. The upper region of the n type substrate 210 between the first drain region 221 and the common source region 230 may serve as the channel region of the first MOSFET 200A. The upper region of the n type substrate 210, between the second drain region 222 and the common source region 230, may serve as the channel region of the second MOSFET 200B.

A first gate insulating layer 241 and a first floating gate layer 251 may be sequentially disposed on the channel region of the first MOSFET 200A. A second gate dielectric layer 242 and a second floating gate layer 252 may be sequentially disposed on the channel region of the second MOSFET 200B. The first gate dielectric layer 241 and the second gate dielectric layer 242 may include an oxide layer. The first floating gate layer 251 and the second floating gate layer 252 may include a polysilicon layer. The first drain region 221 may be electrically coupled to the first drain D1, and the second drain region 222 may be electrically coupled to the second drain D2. As described above with reference to FIG. 8, the first drain D1 and the second drain D2 may be electrically coupled with one of the plurality of first selection lines X1 to Xn. The common source region 230 may be electrically connected with the common source S, and accordingly, may be electrically coupled with one of the plurality of second selection lines Y1 to Ym. The first floating gate layer 251 and the second floating gate layer 252 may be disposed in floating states without electrical contacts.

Figure 10:
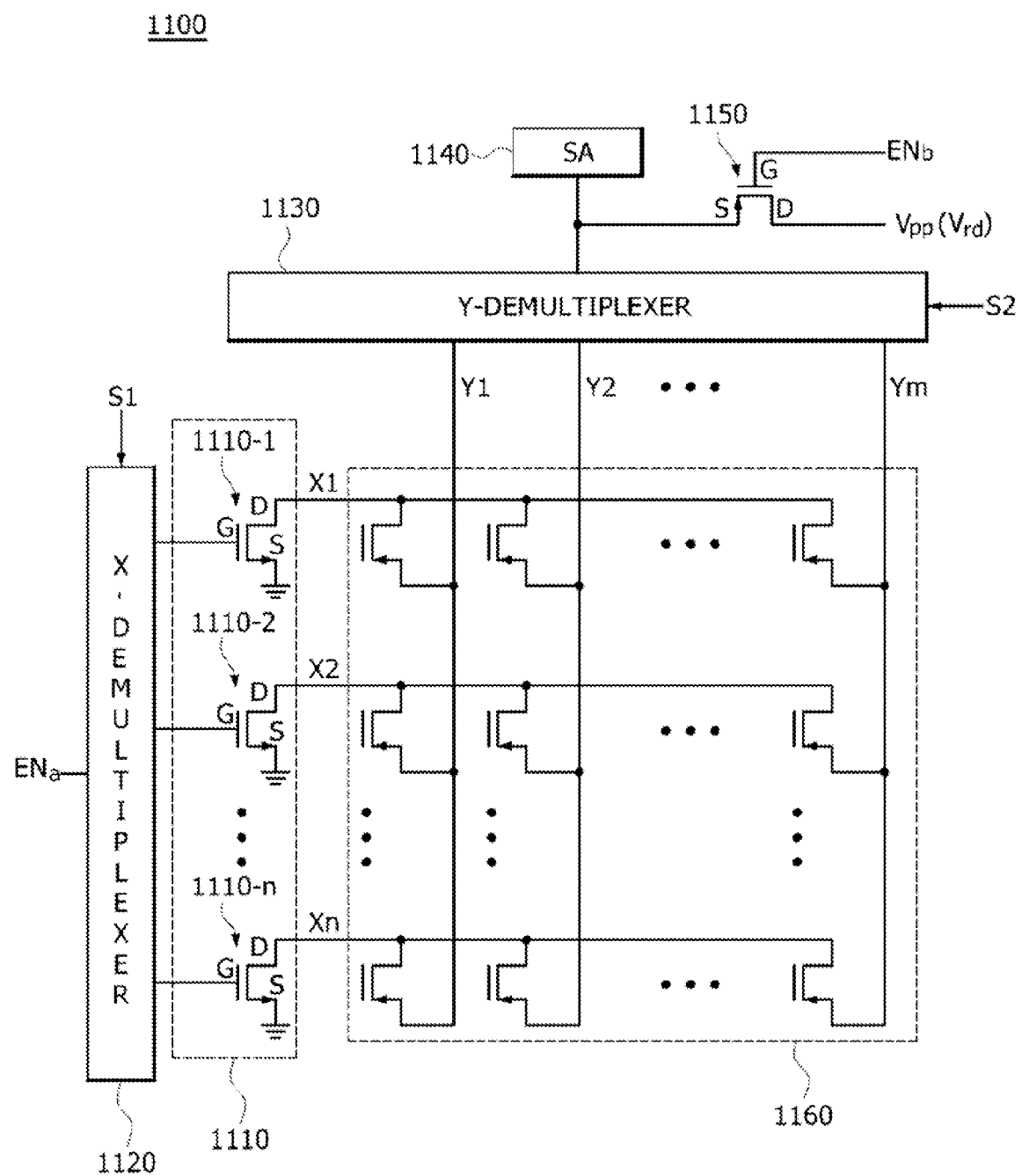
FIG. 10 is a diagram illustrating a memory device including an EPROM cell array according to an embodiment of the present disclosure.

FIG. 10 is a diagram illustrating a memory device 1100 including an EPROM cell array in accordance with an embodiment of the present disclosure. Referring to FIG. 10, a memory device 1100 may include a cell array 1160. The cell array 1160 may be the same as the cell array 10 or cell array 20 described above with reference to FIGS. 1 to 9, and thus, repeated descriptions will be omitted herein.

The plurality of first selection lines X1 to Xn of the cell array 1160 may be electrically coupled with a plurality of the output lines of a switching block 1110, respectively. The switching block 1110 may include a plurality of switching elements 1110-1 to 1110-n. The number of the switching elements 1110-1 to 1110-n may correspond to the number of the first selection lines X1 to Xn. For example, each of the switching elements 1110-1 to 1110-n may be an n-channel-type MOSFET. Each of the switching elements 1110-1 to 1110-n may have a gate G, a drain D electrically coupled with a corresponding one of the plurality of first selection lines X1 to Xn, and a source S electrically coupled to a ground voltage.

One or more of the switching elements 1110-1 to 1110-n may be turned on by signals inputted through the gates G of the switching elements 1110-1 to 1110-n. As described above with reference to FIGS. 3, 4, 6 and 7, when a selective program or read operation is performed for one or more selected unit cells electrically coupled to one of the plurality of first selection lines X1 to Xn, for example, the first selection line X1, only one single switching element, for example, the switching element 1110-1, which is electrically coupled with one of the plurality of first selection lines X1 to Xn, may be turned on, and accordingly, the first selection line X1 may be electrically coupled to the ground voltage, and may be applied with 0V. Meanwhile, the remaining switching elements 1110-2 to 1110-n corresponding to the remaining first selection lines X2 to Xn may be turned off, and accordingly, the remaining first selection lines X2 to Xn may become floating.

Also, as described above with reference to FIG. 5, when a selective program is performed for one or more selected unit cells electrically coupled to one of the plurality of second selection lines Y1 to Ym, some of the plurality of switching elements 1110-1 to 1110-n, for example, the switching elements 1110-1 and 1110-2 electrically coupled with the first selection lines, for example, the first selection lines X1 and X2, which are electrically coupled to the selected unit cell, respectively, may be turned on, and accordingly, the first selection lines X1 and X2 may be electrically coupled to the ground voltage, and may be applied with 0V. Meanwhile, the remaining switching elements 1110-3 to 1110-n, which are electrically coupled to the remaining first selection lines X3 to Xn, may be turned off, and accordingly, the remaining first selection lines X3 to Xn may become floating.

In order to supply one or more input signals to the switching block 1110, the respective gates G of the switching elements 1110-1 to 1110-n may be electrically coupled with an X-demultiplexer 1120. The X-demultiplexer 1120 may have a single input line, a select line, and a plurality of output lines respectively corresponding to the plurality of the switching elements 11104 to 1110-n. The output lines of the X-demultiplexer 1120 may be electrically coupled to the gates G of the switching elements 1110-1 to 1110-n, respectively. The input line of the X-demultiplexer 1120 may be electrically coupled with an input line of a first enable signal ENa. The select line of the X-demultiplexer 1120 may be electrically coupled with an input line of a select signal S1. In an example, the select signal S1 may be address-type multi-bit data, and in this case, only one select line may be disposed. In another example, the select signal S1 may be single-bit data, and in this case, a plurality of select lines may be disposed.

The respective second selection lines Y1 to Ym may be electrically coupled with a Y-demultiplexer 1130. The Y-demultiplexer 1130 may have a plurality of output lines, a single input line, and a select line. The plurality of output lines of the Y-demultiplexer 1130 may be electrically coupled with the second selection lines Y1 to Ym, respectively. The input line of the Y-demultiplexer 1130 may be electrically coupled with one sense amplifier (SA) 1140. The select line of the Y-demultiplexer 1130 may be electrically coupled with an input line of a select signal S2. In an example, the select signal S2 may be address-type multi-bit data, and in this case, only one select line may be disposed. In another example, the select signal S2 may be single-bit data, and in this case, a plurality of select lines may be disposed. A switching element 1150 may be disposed between the sense amplifier 1140 and the Y-demultiplexer 1130. The switching element 1150 may be a p channel type MOSFET having a gate G, a drain D, and a source S. An input line of a second enable signal ENb may be electrically coupled to the gate G of the switching element 1150, an input line of the program voltage Vpp and the read voltage Vrd may be electrically coupled to the drain D, and the source S may be electrically coupled to the input line of the Y-demultiplexer 1130.

During the program operation or the read operation, the second enable signal ENb may be inputted to the gate G of the switching element 1150, and accordingly, the switching element 1150 may be turned on. As the switching element 1150 is turned on, the program voltage Vpp or the read voltage Vrd inputted to the drain D may be transferred to the Y-demultiplexer 1130. The Y-demultiplexer 1130 may transfer the program voltage Vpp or the read voltage Vrd to selected one among the plurality of second selection lines Y1 to Ym according to the select signal S2 inputted thereto. The remaining second selection lines may become floating. One of the plurality of second selection lines Y1 to Ym selected by the select signal S2 may be electrically coupled to the selected unit cell for the program or read operation.

When a selective program or read operation is performed for one or more selected unit cells electrically coupled to one or more of the plurality of second selection lines Y1 to Ym as described above with reference to FIGS. 3 to 7, the program voltage Vpp or the read voltage Vrd may be applied to one or more of the plurality of second selection lines Y1 to Ym, which is electrically coupled to the one or more selected unit cells, and the remaining second selection lines become floating.

During the read operation for the one or more selected unit cell of the cell array 1160, current flowing through the selected unit cell may be transferred to the sense amplifier 1140 through one or more of the plurality of second selection lines Y1 to Ym electrically coupled to the one or more selected unit cells and the sense amplifier 1140 may sense an amount of current, and determine the program state of the one or more selected unit cells based on the sensing result. The sense amplifier 1140 may be provided in plural for the reading operation on the plurality of selected unit cells.

Figure 11:
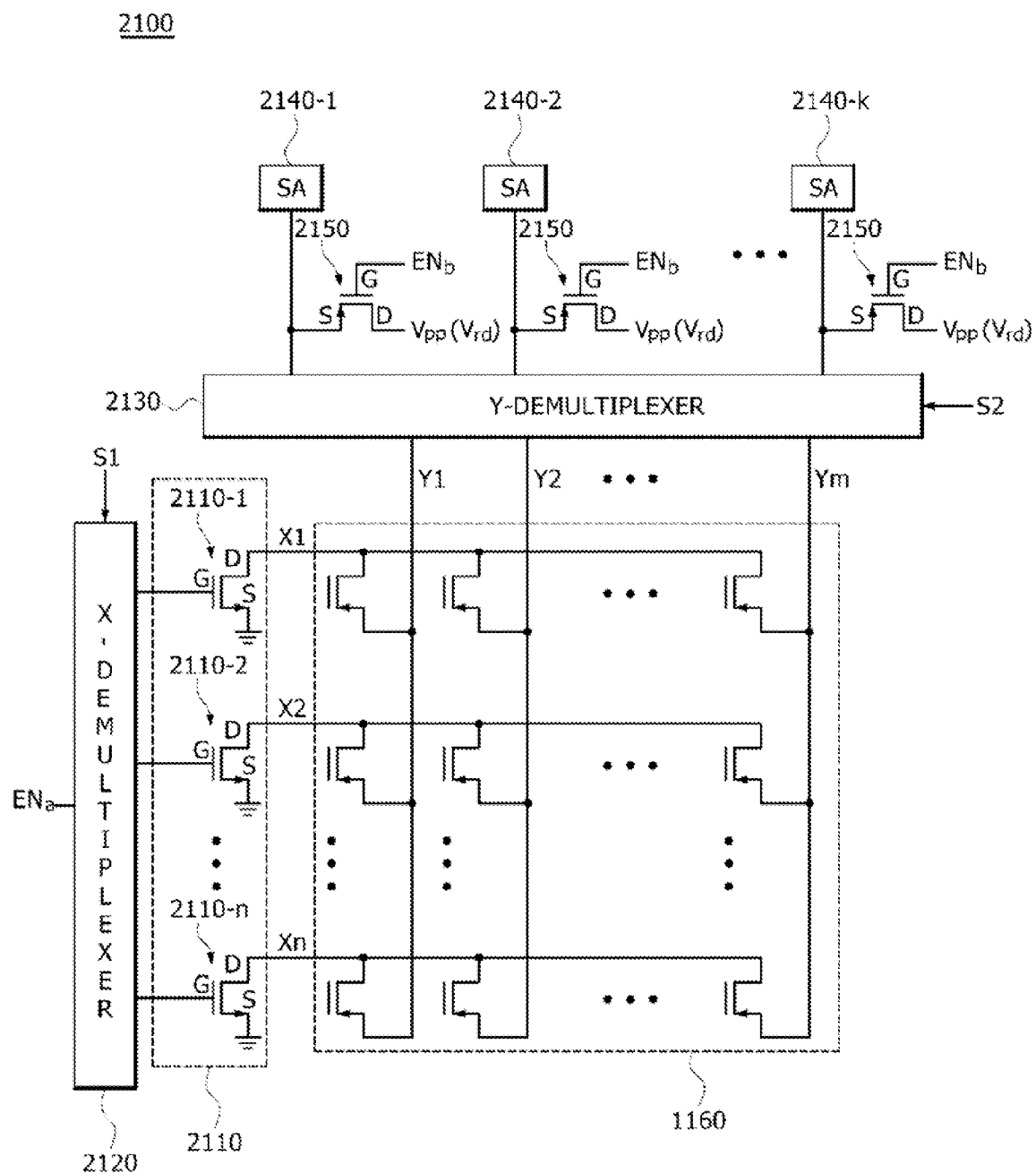
FIG. 11 is a diagram illustrating a memory device including an EPROM cell array according to an embodiment of the present disclosure.

FIG. 11 is a diagram illustrating a memory device 2100 including an EPROM cell array in accordance with an embodiment of the present disclosure. Referring to FIG. 11, a memory device 2100 may include a cell array 1160. The cell array 1160 may be the same as the cell array 10 or cell array 20 described above with reference to FIGS. 1 to 9, and thus, repeated descriptions will be omitted herein.

The plurality of first selection lines X1 to Xn, the plurality of second selection lines Y1 to Ym, a switching block 2110, and an X-demultiplexer 2120 of the memory device 2100 may be the same as the plurality of first selection lines X1 to Xn, the plurality of second selection lines Y1 to Ym, the switching block 1110, and the X-demultiplexer 1120 of the memory device 1100 described above with reference to FIG. 10, and thus, repeated descriptions will be omitted herein.

The respective second selection lines Y1 to Ym may be electrically coupled with a Y-demultiplexer 2130. The Y-demultiplexer 2130 may have a plurality of output lines, a plurality of input lines, and a select line. The plurality of output lines of the Y-demultiplexer 2130 may be electrically coupled with the second selection lines Y1 to Ym, respectively. The plurality of input lines of the Y-demultiplexer 2130 may be electrically coupled with a plurality of sense amplifiers 2140-1 to 2140-$k$. The number of the sense amplifiers 2140-1 to 2140-$k$ may correspond to the number of the input lines of the Y-demultiplexer 2130, and may be less than the number of the second selection lines Y1 to Ym. The number k of the sense amplifiers 2140-1 to 2140-$k$, and the number m of the second selection lines Y1 to Ym may have relationship of $2^\gamma = m/k$, where $\gamma$ is the number of address bits of the select signal S2 or the number of select lines. The select line of the Y-demultiplexer 2130 may be electrically coupled with an input line of the select signal S2. In an example, the select signal S2 may be address-type multi-bit, for example, k-bit data, and in this case, a single select line may be disposed. In another example, the select signal S2 may be single-bit data, and in this case, a plurality of, for example, k number of, select lines may be disposed.

A plurality of switching elements 2150 may be disposed between the sense amplifiers 2140-1 to 2140-$k$ and the Y-demultiplexer 2130, respectively. Each switching element 2150 may be a p channel type MOSFET having a gate G, a drain D, and a source S. An input line of a second enable signal ENb may be electrically coupled to the gates G of the plurality of switching elements 2150, respectively, an input line of a program voltage Vpp or a read voltage Vrd may be electrically coupled to the drains D of the plurality of switching elements 2150, and the sources S of the plurality of switching elements 2150 may be electrically coupled to the plurality of input lines of the Y-demultiplexer 2130.

During the program operation or the read operation of the memory device 2100, one or more second selection lines Y1 to Ym, which are electrically coupled to one or more selected unit cells in the cell array 1160, may be electrically coupled with one or more of the plurality of input lines (hereinafter, referred to as one or more 'selected input lines') of the Y-demultiplexer 2130 by the select signal S2, and the remaining ones of the plurality of second selection lines Y1 to Ym may be electrically coupled with the remaining ones of the plurality of input lines (hereinafter, referred to as 'unselected input lines') of the Y-demultiplexer 2130. The second enable signal ENb may be inputted to the gate G of the switching elements 2150, which are electrically coupled with the one or more selected input lines, and accordingly, the switching elements 2150, which are electrically coupled with the one or more selected input lines, may be turned on. As the switching elements 2150 corresponding to the one or more selected input lines may be turned on, the program voltage Vpp or the read voltage Vrd applied to the drains D of the switching elements 2150 corresponding to the one or more selected input lines may be transferred to the Y-demultiplexer 2130 through the one or more selected input lines. The program voltage Vpp or the read voltage Vrd transferred to the Y-demultiplexer 2130 may be transferred to the one or more of the second selection lines Y1 to Ym, which are electrically coupled to the one or more selected unit cells. Conversely, the second enable signal ENb may not be inputted to the gates G of the switching elements 2150, which are electrically coupled with the unselected input lines, and accordingly, the switching elements 2150, which are electrically coupled with the unselected input lines, may be turned off. As the switching elements 2150 corresponding to the unselected input lines are turned off, the remaining of the second selection lines Y1 to Ym, which are electrically coupled with the unselected input lines, may float.

The Y-demultiplexer 2130 may have decoding circuits for decoding addresses included in the select signal S2 such that the selected second selection lines and the corresponding input lines of the Y-demultiplexer 2130 may he electrically coupled to each other, respectively, For the one or more selected unit cells, 0V may be applied to one or more of the plurality of first selection lines X1 to Xn corresponding to the one or more selected unit cells, the program voltage Vpp or the read voltage Vrd may be applied to one or more of the plurality of second selection lines Y1 to Ym corresponding to the one or more selected unit cells, and accordingly, the program operation or the read operation may be performed on the one or more selected unit cells in the same manner as described above with reference to FIGS. 1 to 9.

Figure 12:
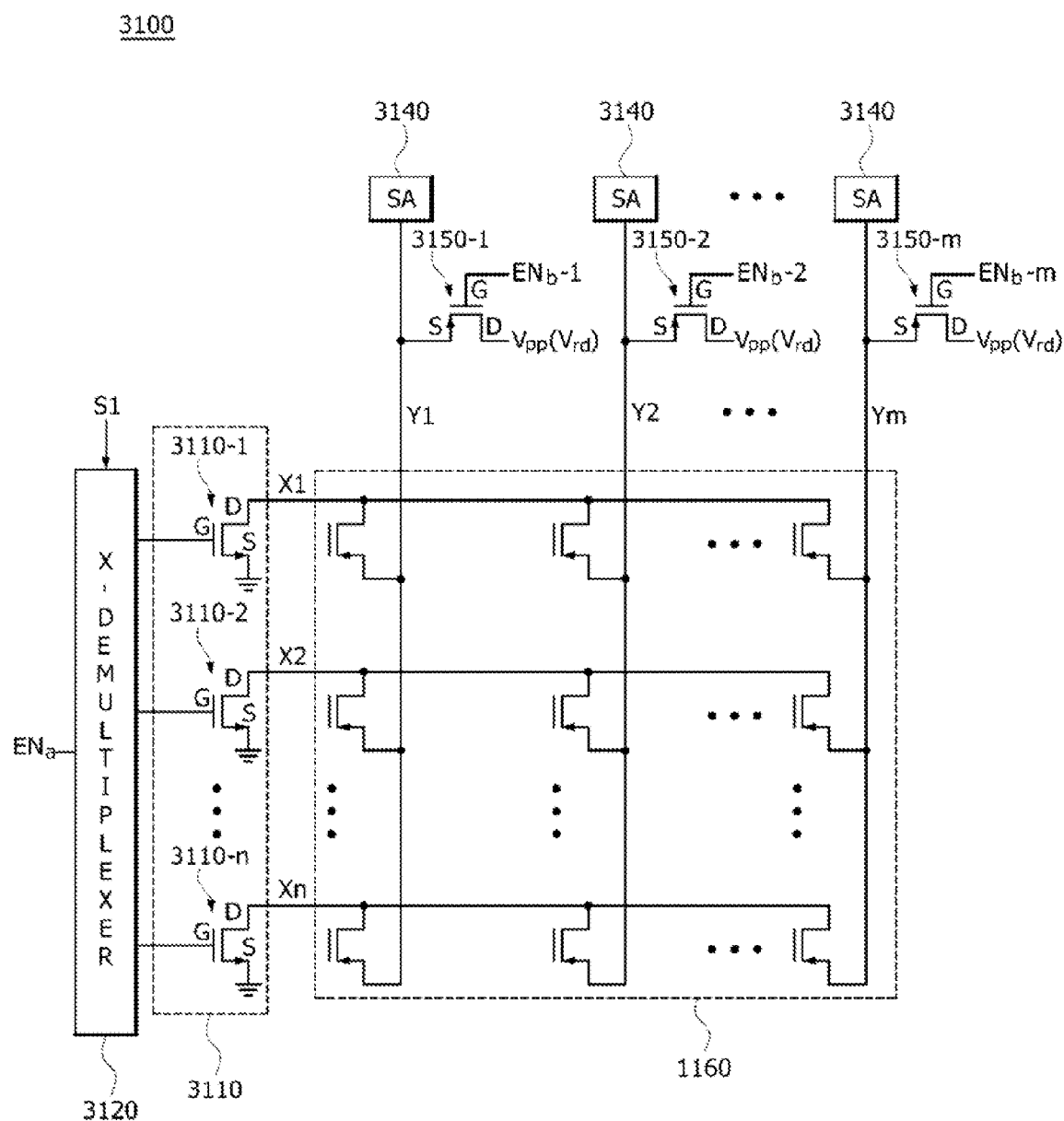
FIG. 12 is a diagram illustrating a memory device including an EPROM cell array according to an embodiment of the present disclosure.

FIG. 12 is a diagram illustrating a memory device 3100 including an EPROM cell array in accordance with an embodiment of the present disclosure. Referring to FIG. 12, a memory device 3100 may include a cell array 1160. The cell array 1160 may be the same as the cell array 10 or cell array 20 described above with reference to FIGS. 1 to 9, and thus, repeated descriptions will be omitted herein.

The plurality of first selection lines X1 to Xn, the plurality of second selection lines Y1 to Ym, a switching block 3110 and an X-demultiplexer 3120 of the memory device 3100 may be the same as the plurality of first selection lines X1 to Xn, the plurality of second selection lines Y1 to Ym, the switching block 1110, and the X-demultiplexer 1120 of the memory device 1100 described above with reference to FIG. 10 and thus, repeated descriptions will be omitted herein.

The plurality of second selection lines Y1 to Ym may be electrically coupled with the plurality of sense amplifiers 3140, respectively. The number of the sense amplifiers 3140 may correspond to the number of the second selection lines Y1 to Ym. A plurality of switching elements 3150-1 to 3150-$m$ may be disposed between the second selection lines Y1 to Ym and the sense amplifiers 3140, respectively. Each of the switching elements 3150-1 to 3150-$m$ may be of p channel type MOSFET having a gate G, a drain D, and a source S. A plurality of input lines of second enable signals ENb-1 to ENb-$m$ may be electrically coupled to the gates G of the switching elements 3150-1 to 3150-$m$, respectively, an input line of a program voltage Vpp or a read voltage Vrd may be electrically coupled to the drains D of the switching elements 3150-1 to 3150-$m$, and the sources S of the switching elements 3150-1 to 3150-$m$ may be electrically coupled to the plurality of second selection lines Y1 to Ym, respectively.

During the program operation or the read operation of the memory device 3100, one or more of the second enable signals ENb 1 to ENb-$m$ may be inputted to the gates G of the switching elements 3150-1 to 3150-$m$, which are electrically coupled with the one or more of the second selection lines Y1 to Ym corresponding to the one or more selected unit cells in the cell array 1160. Conversely, the remaining ones of the second enable signals ENb-1 to ENb-$m$ may not be inputted to the gates G of the switching elements 3150-1 to 3150-$m$ electrically coupled with the remaining second selection lines corresponding to the unselected unit cells. Accordingly, the program voltage Vpp or the read voltage Vrd may be applied to the second selection lines electrically coupled to the one or more selected unit cells, and the remaining second selection lines become floating states. For the one or more selected unit cells, 0V and the program voltage Vpp or the read voltage Vrd may be respectively applied to the first selection lines and the second selection lines corresponding to the one or more selected memory cells, and accordingly, the program operation or the read operation may be performed for the one or more selected memory cells as described above with reference to FIGS. 1 to 9.

The EPROM cell array and the memory device according to the various exemplary embodiments of the present disclosure may be applied to various application fields. For instance, the EPROM cell array and the memory device according to the embodiments may be applied to a trimming analogue circuit. While the specifications of electronic devices may vary due to the dispersion of products that are produced in a die or wafer, in this case, it is necessary to enable inherent calibration to be performed by a die or by a wafer, by inputting specified codes into a memory device in the trimming circuit. The EPROM cell array and the memory device according to the various exemplary embodiments of the present disclosure may be integrated in a memory device in a trimming circuit.

For another example, the EPROM cell array and the memory device according to the various exemplary embodiments of the present disclosure may be applied to a device that repairs physically failed cells with redundancy cells. In the case of an image sensor such as a CMOS image sensor (CIS), a failed pixel is found, the address of the failed pixel is stored, and then the failed pixel is repaired through the image information of a processor. In this course, the EPROM cell array and the memory device according to the embodiments may be applied to a memory device for processing data for failed pixels.

For still another example, the EPROM cell array and the memory device according to the various exemplary embodiments of the present disclosure may be applied to a memory device for storing the firmware of an electronic system or a memory device, in which product-related information may be stored. Further, the EPROM cell array and the memory device according to the various exemplary embodiments of the present disclosure may be applied to settlement information, card information, an embedded nonvolatile memory (eNVM), an RFID memory, etc. In any case, program and read operations may be performed for a selected unit cell without a selection transistor, and accordingly, the entire area of an electronic system which may be applied with the EPROM cell array and the memory device according to the embodiments, may be reduced.

While various embodiments have been described above, it will be understood to those skilled in the art that the embodiments described are by way of example only. Accordingly, the EPROM cell array, the method of operating the same, and the memory device including the same described herein should not be limited based on the described embodiments.

What is claimed is:

1. An EPROM cell array comprising:
   a cell array including multiple unit cells, each of which consists of a p-channel MOSFET having a P+ drain, a P+ source, a channel region between the P+ drain and P+ source, and a floating gate, and which are disposed in an array with a plurality of rows and a plurality of columns;
   multiple first selection lines each coupled with P+ drains of unit cells, which are disposed on the same row among the multiple unit cells; and
   multiple second selection lines each coupled with P+ sources of unit cells, which are disposed on the same column among the unit cells,
   wherein a selected unit cell is programmed by applying a program voltage and a ground voltage to a first selection line and a second selection line to be coupled with the selected unit cell, respectively, or by applying a program voltage and a ground voltage to the second selection line and the first selection line to be coupled with the selected unit cell, respectively.

2. The EPROM cell array of claim 1, wherein the selected unit cell is selected by applying 0V to one of the multiple first selection lines, which is coupled to the selected unit cell, by applying a program voltage or a read voltage to one of the multiple second selection lines, which is coupled to the selected unit cell, and by floating the remaining multiple first and second selection lines.

3. The EPROM cell array of claim 1, wherein each of the multiple unit cells comprises multiple MOSFETs coupled to each other in parallel.

4. The EPROM cell array of claim 3, wherein drains of the multiple MOSFETs are commonly coupled to one of the multiple first selection lines, and sources of the multiple MOSFETs are commonly coupled to one of the multiple second selection lines.

5. A memory device comprising:
an EPROM cell array including a cell array having multiple unit cells, each of which consists of a p-channel MOSFET having a P+ drain, a P+ source, a channel region between the P+ drain and P+ source. and a floating gate, and which are disposed in an array with a plurality of rows and a plurality of columns, multiple first selection lines each coupled with N+ drains of unit cells disposed on the same row among the unit cells, and multiple second selection lines each coupled with N+ sources of unit cells disposed on the same column among the unit cells, wherein a selected unit cell is programmed by applying a program voltage and a ground voltage to a first selection line and a second selection line to be coupled with the selected unit cellrespectively, or by applying a program voltage and a ground voltage to the second selection line, and the first selection line to be coupled with the selected unit cell, respectively;
a switching block suitable for selectively applying 0V to one or more of the multiple first selection lines;
a first demultiplexer suitable for selectively enabling the switching block;
a second demultiplexer suitable for selecting one or more of the multiple second selection lines; and
one or more switching elements suitable for transferring the program voltage or the read voltage to the second demultiplexer.

6. The memory device of claim 5, wherein the first demultiplexer receives a first enable signal, and selectively outputs the first enable signal to one or more of the multiple first selection lines through the switching block.

7. The memory device of claim 6, wherein the switching block comprises a plurality of MOSFETs.

8. The memory device of claim 6, wherein each of the MOSFETs is turned on or off according to the first enable signal from the first demultiplexer, and has a drain coupled to each of the multiple first selection lines, and a source coupled to a ground voltage.

9. The memory device of claim 5, wherein the second demultiplexer transfers the program or read voltage from the switching elements to one or more of the multiple second selection lines in response to a select signal.

10. The memory device of claim 9, further comprising one or more sense amplifiers coupled to the second demultiplexer.

11. The memory device of claim 9, wherein each of the switching elements comprises a MOSFET.

12. The memory device of claim 11, wherein the MOSFET is turned on or off according to a second enable signal, and transfers the program voltage or the read voltage to the second demultiplexer.

13. The memory device of claim 10, wherein the number of the sense amplifiers is less than the number of the multiple second selection lines.

14. A memory device comprising:
an EPROM cell array including a cell array having multiple unit cells, each of which consists of a p-channel MOSFET having a P+ drain, a P+ source, a channel region between the P+ drain and P+ source. and a floating gate, and which are disposed in an array with a plurality of rows and a plurality of columns, multiple first selection lines each coupled with N+ drains of unit cells disposed on the same row among the unit cells, and multiple second selection lines each coupled with N+ sources of unit cells disposed on the same column among the unit cells, wherein a selected unit cell is programmed by applying a program voltage and a ground voltage to a first selection line and a second selection line to be coupled with the selected unit cell, respectively, or by applying a program voltage and a ground voltage to the second selection line and the first selection line to be coupled with the selected unit cell, respectively;
a switching block suitable for selectively applying 0V to one or more of the multiple first selection lines;
a first demultiplexer suitable for selectively enabling the switching block;
multiple sense amplifiers coupled to the multiple second selection lines, respectively; and
multiple switching elements coupled between the multiple second selection lines and the multiple sense amplifiers, respectively, and suitable for selectively transferring the program voltage or the read voltage to the multiple second selection lines.

15. The memory device of claim 14, wherein each of the multiple switching elements comprises a MOSFET.

16. The memory device of claim 15, wherein the MOSFET is turned on or off according to a second enable signal, and transfers the program voltage or the read voltage to the second selection lines.

17. An EPROM cell array comprising:
a cell array including multiple unit cells, each of which includes a p-channel MOSFET having a P+ drain, a P+ source, a channel region between the P+ drain and P+ source, and a floating gate, and which are disposed in an array with a plurality of rows and a plurality of columns;
multiple first selection lines each coupled with P+ drains of unit cells, which are disposed on the same row among the multiple unit cells; and
multiple second selection lines each coupled with P+ sources of unit cells, which are disposed on the same column among the unit cells,
wherein a selected unit cell to be programmed or read is selected by one of the multiple first selection lines, and one of the multiple second selection lines,
wherein the floating gate is disposed over the channel region without overlapping with the P+ drain.

* * * * *